United States Patent [19]
Yih et al.

[11] Patent Number: 5,831,906
[45] Date of Patent: Nov. 3, 1998

[54] READ/WRITE COLLISON-FREE STATIC RANDOM ACCESS MEMORY

[75] Inventors: Jian-Yau Yih, Taoyuan; Nang-Ping Tu, Hsinchu, both of Taiwan

[73] Assignee: Industrial Technology Research Institute, Taiwan

[21] Appl. No.: 827,043

[22] Filed: Mar. 25, 1997

[30] Foreign Application Priority Data

Sep. 23, 1996 [TW] Taiwan ................................. 85111700

[51] Int. Cl.⁶ .................................................. G11C 7/00
[52] U.S. Cl. ................................. 365/189.04; 365/230.03
[58] Field of Search ......................... 365/189.04, 230.03, 365/189.01

[56] References Cited

U.S. PATENT DOCUMENTS 5,638,335 6/1997 Akiyama et al. .................. 365/230.03
5,646,695 7/1997 Fujiwara et al. ............... 365/230.03 X

*Primary Examiner*—Do Hyun Yoo
*Attorney, Agent, or Firm*—Randall J. Knuth

[57] ABSTRACT

A read/write collision-free static random access memory which can perform read/write operations simultaneously without read/write collisions. The static random access memory includes a plurality of memory cells and its features are that the memory cells are divided into several memory banks wherein each bank has independent reading and writing paths. The number of memory cells for each memory bank can be determined by a specific length of memory cells between some memory cells undergoing reading operation and other memory cells undergoing writing operation, and by the reading speed of said reading operation and the writing speed of the writing operation, whereby the reading operation and the writing operation read and write to two different memory banks of the static random access memory at the same time such that read/write collisions can be prevented.

12 Claims, 4 Drawing Sheets

READ/WRITE COLLISON-FREE STATIC RANDOM ACCESS MEMORY

BACKGROUND OF THE INVENTION

1. Field of the Invention

The present invention relates to an integrated circuit memory structure, more particularly to a static random access memory (SRAM) which can perform reading and writing operation simultaneously, and is appropriate for certain video and speech processing.

2. Description of Related Art

Static random access memory (hereinafter is called as SRAM) is a general memory device, and a kind of volatile memory, i.e., when the SRAM power supply is shut down, the data stored in the SRAM is also erased. The way that an SRAM stores data depends on the conduction states of the transistors in SRAM, which is different from that for dynamic random access memory (DRAM), which depends on the charging of the capacitor. The access time of SRAM is quite short, so it usually acts as cache memory in a computer system and is appropriate for the application of real time video and speech processing.

FIG. 1A illustrates a circuit diagram of a SRAM memory cell commonly used in NMOS logic systems. The latch consists of transistors M1, M2, M3, and M4, wherein transistors M3 and M4 act as the active load and the logic signals with different logic levels are generated on the node X and Y. Wordline W is used for addressing to control the states (on or off) of the transistors MS and M6, and Bit lines B and $\overline{B}$ read or write the logic levels on the node X and Y respectively. The SRAM cell structure of a CMOS logic system is quite similar to that shown in FIG. 1A, and the main difference is that the latch is made of CMOS circuit as shown in FIG. 1B. FIG. 1B illustrates a circuit diagram of a SRAM cell structure commonly used in conventional CMOS logic systems. The latch consists of transistors M7, M8, M9, M10, wherein M7 and M8 are NMOS transistors, and M9 and M10 are PMOS transistors. During the reading and writing cycle, the path for data accessing is controlled similarly by transistors M11 and M12, and the operation for reading and writing is the same as that of NMOS SRAM cell.

From FIGS. 1A and 1B, it is obvious that a SRAM cell consists of 6 transistors regardless of whether it is applied in an NMOS or CMOS logic system. Although the transistors which act as active loads in the latch of a SRAM cell can be replaced by poly Si resistors, a SRAM cell still consists of at least 4 transistors. Therefore, the integrity of the SRAM is lower than that of the DRAM and the cost of the SRAM is higher.

Moreover, SRAM must perform reading and writing operation simultaneously in some video and speech applications. The conventional SRAM structure is the same as the general memory structure, and the memory cells shown in FIG. 1 are arranged as an array to form the SRAM structure. The memory cells in every one row of the array are addressed by the same word line, and the memory cells in every column of the array are used to read or write data by the same bit line. The peripheral circuits of a SRAM include a row decoder, column decoder, and a sense amplifier to handle the reading and writing operation. However, the word line and bit line of the conventional SRAM structure are shared, and if the reading and writing operations are performed simultaneously, read/write collisions will occur. Thus reading and writing operations are performed separately making the conventional SRAM inappropriate for video or speech applications. The conventional SRAM structure that can perform reading and writing operations simultaneously has a two-port structure to prevent read/write collisions, i.e., in the same SRAM, it has two duplicate memory ports which are independent and have the same address and memory length. However, it performs reading and writing interlacedly. When the data are written into the first memory port, the second memory port is performing a reading operation; when the data are written into the second memory port, the first memory port is performing the reading operation. The reading and writing operations are performed continuously for the SRAM with a two-port structure, so the SRAM performs reading and writing simultaneously and is appropriate for video and audio processing.

However, the two-port structure SRAM described above requires more memory cells and thus occupies more wafer area than the conventional one-port SRAM. The two-port SRAM consists of 12 transistors, twice as much as those in the conventional SRAM, and thus the integrity of two-port SRAM is lower and the cost is higher.

SUMMARY OF THE INVENTION

Accordingly, the present invention provides a SRAM which can perform reading and writing operations simultaneously, wherein the SRAM does not need two ports to prevent read/write collisions, i.e., the number of transistors in the SRAM is still 6 or 4 such that the integrity is improved and the cost is reduced.

In accordance with the above object, the prevent invention provides a static random access memory which can perform reading and writing operations simultaneously without data collision comprising:

a plurality of memory cells;

a plurality of memory banks which are formed by dividing said memory cells into several blocks, wherein every one of said memory banks has independent reading paths and writing paths, and the memory cell numbers of every one of said memory banks are determined by a specific length of memory cells between some memory cells undergoing reading and the other memory cells undergoing writing and by the reading speed of said reading operation and the writing speed of said writing operation, and whereby said reading operation and said writing operation reads and writes to two different memory banks of said static random access memory in the same time. Further, there are no restrictions on the writing and reading speeds of said static random access memory. In general, there are two SRAM operating modes: the reading and writing speed of the SRAM are the same; and the reading speed of the SRAM is twice that of its writing speed.

In the first mode ,where the reading speed and writing speed of the SRAM are the same, all the memory cells in the SRAM can be read and written sequentially. When said static random access memory has N memory cells, the memory cell interval between a memory cell under reading operation and another memory cell under writing operation has A memory cells, and the number of memory cells in each one of said memory banks is no greater than A, wherein N and A are integers. If all memory banks have the same number of memory cells, the number of all the memory banks is greater than N/A.

In the second mode, the reading speed of the SRAM is twice that of its writing speed, and the number of the memory cells in the SRAM is N. When the first memory cell of said N memory cells is written to during a writing operation, the Q-th memory cell of said N memory cells is being read during a reading operation, and when the P-th memory cell of said N memory cells is written to during a writing operation, the first memory cell of said N memory cell is being read during a reading operation. The number of memory cells in the first memory bank of said memory banks is no greater than Q, and the number of memory cell in each one of the other memory banks is no greater than P−T, wherein T is one half of the total number of memory cells in all banks before said P-th memory cells, and N, P, Q, and T are integers.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

To make the objects, features, and advantages more obvious and understandable, the present invention is described in detail as follows in accompaniment with the embodiments and drawings.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

The present invention discloses a SRAM which can perform reading and writing operations simultaneously, wherein the memory cells in the SRAM are divided into several memory banks. Every memory bank has independent reading and writing paths, i.e., when one memory bank is performing a read/write operation, another memory bank is performing different read/write operation in the same time, and data processing collisions will not occur. The number of memory cells in every memory bank can be determined by the length of memory cells that is separated by the reading and writing operations, and the reading and writing speeds. The number of memory cells contained in every memory bank is determined by the requirement that the SRAM should perform reading and writing operations to access data in different memory banks at the same time. Every memory bank has independent reading and writing paths such that read/write collisions can be prevented. However, in general, two operating modes are used, one wherein the speed of reading is the same as that of writing, or a second mode wherein the speed of reading is twice that of writing. The embodiments involving the two above mentioned modes are described as follows.

Embodiment 1: (the same reading and writing speed)

Figure 1A:
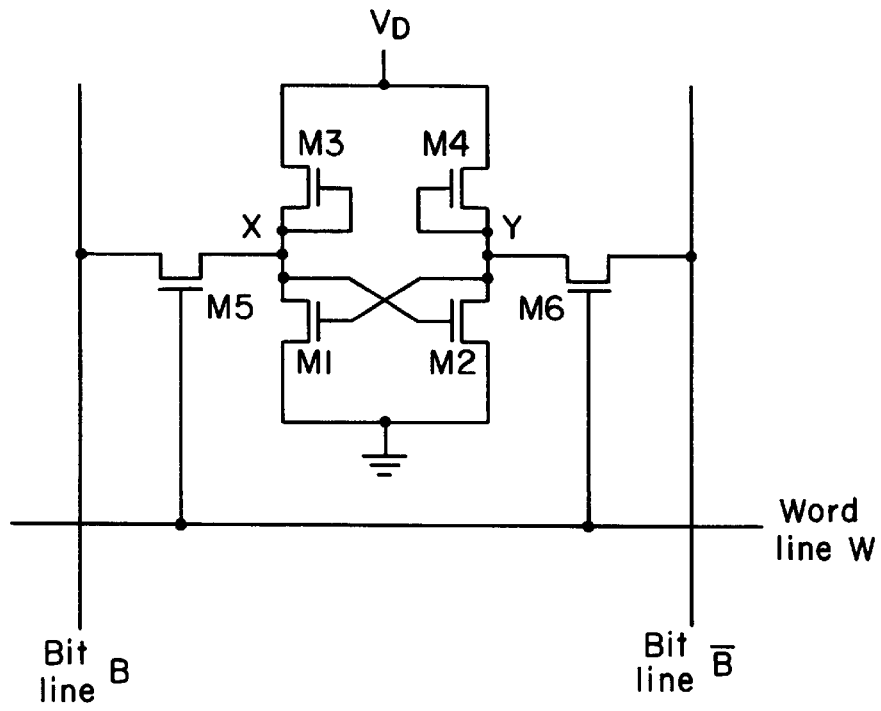
FIG. 1A illustrates a circuit diagram of a SRAM memory cell commonly used in a NMOS logic system according to the prior art.
Figure 1B:
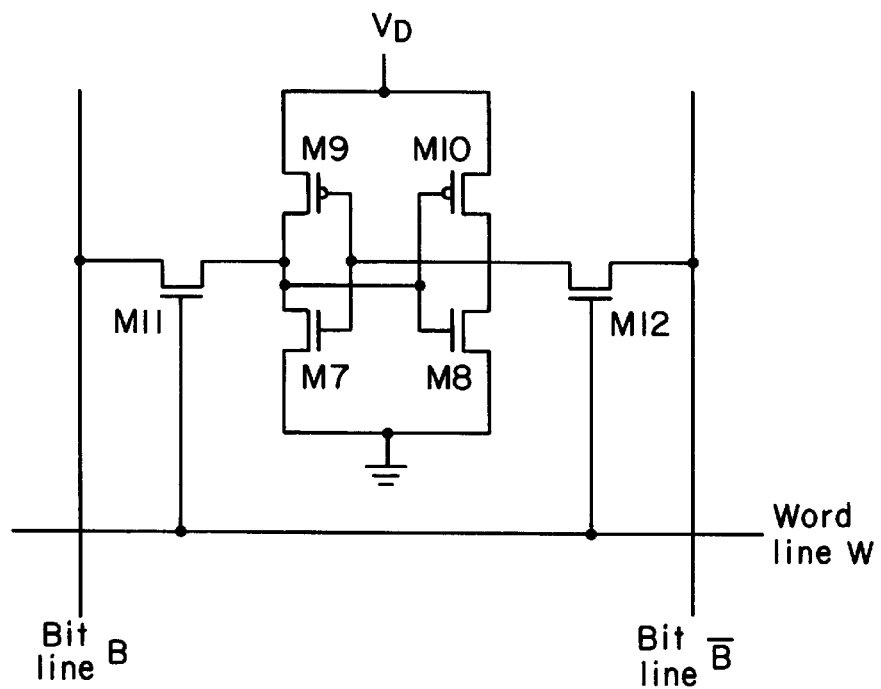
FIG. 1B illustrates a circuit diagram of a SRAM memory cell commonly used in a CMOS logic system according to the prior art.
Figure 2:
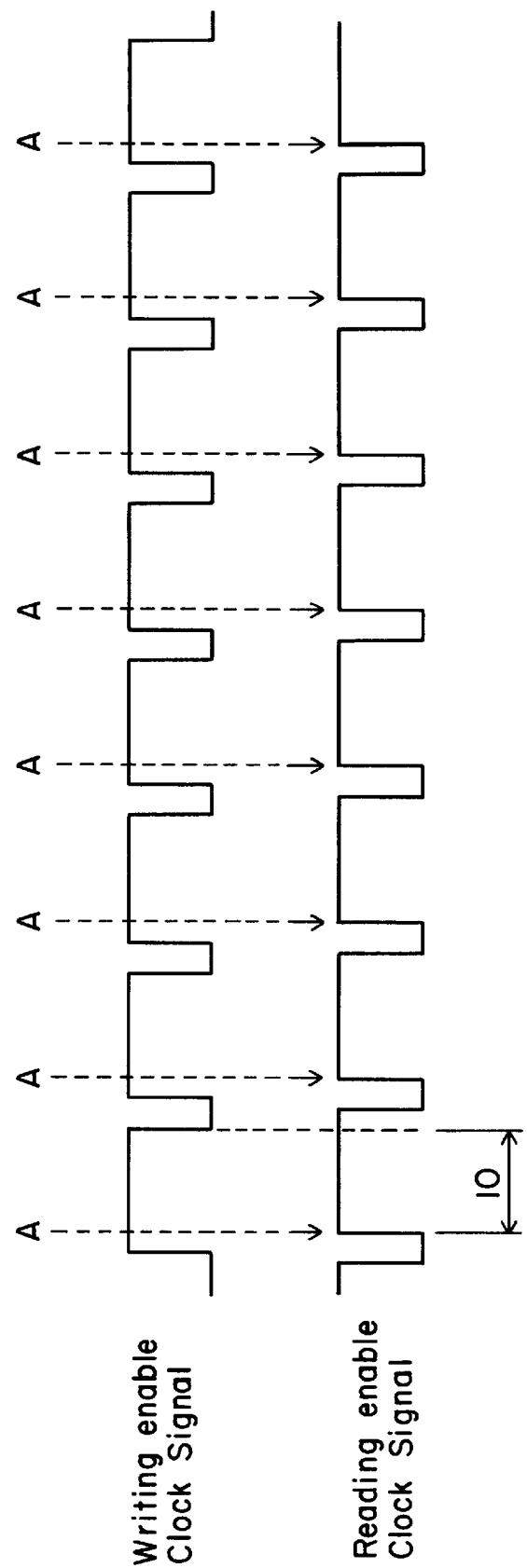
FIG. 2 illustrates the reading and writing enable clock signal of the first embodiment according to the present invention, wherein the speed of reading is the same as that of writing.

FIG. 2 illustrates the reading and writing enable clock signal of the first embodiment according to the present invention, wherein the speed of reading is the same as that of writing. In FIG. 2, it is obvious that the reading enable clock signal and writing enable clock signal are determined by the same clock frequency, i.e., the reading and writing speeds are equal. Provided that the numbers of memory cells in a SRAM is N, and all the memory cells can be accessed sequentially, thus the processing of data accessing is carried out sequentially from the first memory cell to the N-th memory cell during the writing and reading enable clock signal shown in FIG. 2.

As shown in FIG. 2, when the first memory cell is written, the reading operation is not performed, and therefore a read/write collision will not occur. When the writing operation is performed to the A-th memory cell, the reading operation begins to be carried out, and therefore in the conventional SRAM, a read/write collision will occur until the writing operation is completed. It is noticeable that reading operations and writing operations are always separated by a length of A memory cells in the read/write collision area 10. Consequentially, when the reading speed and the writing speed are the same, only if the memory cell numbers of every memory bank are less than A, will the reading and writing operations not access the same memory cell at the same time, and the read/write collision be prevented.

For physical applications, not only must the number of memory cells in every memory bank be less than A, but the following two conditions must also be considered. First, the smaller the numbers of memory banks in SRAM the better. Because every memory bank must have independent reading and writing paths, the periphery circuits of the SRAM also must be designed respectively. Therefore, the smaller the number of the memory banks, the less the area required by periphery circuits, and thus the lower the fabrication cost. Second, the number of memory cells in every memory bank should be the same, or in proportional relation to be suitable for layout design. In the design of a VLSI layout, the cell with the same layout form can be easily duplicated, and thus the design complexity and cost can be reduced.

For example, a SRAM has 1024 memory cells, i.e., N=1024; the position where the reading and writing operation begin to collide is at the 300-th memory cell, i.e., A=300. Therefore, the number of memory cells in every memory bank must be less than 300, such that read/write collisions can be prevented. The number of memory banks must be equal to or larger than 4, because of the following calculation N/A=1024/300≅3.41. Consequentially, 1024 memory cells are divided into 4 memory banks, and every memory bank has 256 memory cells. Such the division of the memory cells can achieve the above requirements: the number of memory cell in every memory bank is less than A (300); and the number of memory banks is the minimum (here, 4). However, this example does not restrict the applications of the invention, and for those who are skilled in this art can modify the number of memory cells in every bank and the number of memory banks for a variety of conditions, just as long as the memory cell numbers of every bank is less than A.

Embodiment 2: (read-speed/write-speed=2)

Figure 3:
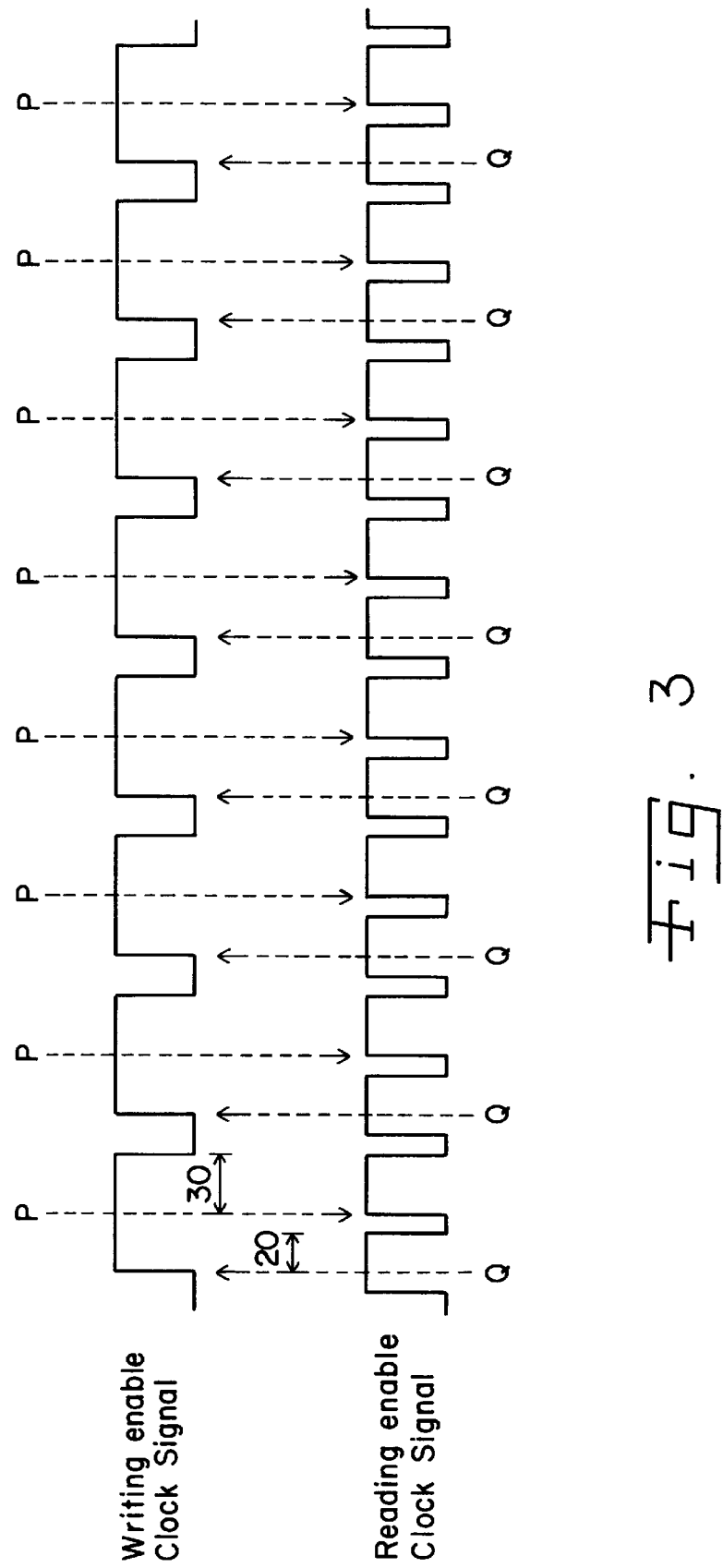
FIG. 3 illustrates the reading and writing enable clock signal of the second embodiment according to the present invention, wherein the speed of reading is twice that of writing.

FIG. 3 illustrates the reading and writing enable clock signal of the second embodiment according to the present invention, wherein the speed of reading is twice that of writing. In FIG. 3, it is obvious that the speed of reading is twice that of writing. Provided that the numbers of memory cells in a SRAM is N, and all the memory cells can be accessed sequentially, thus data accessing is carried out sequentially from the first memory cell to the N-th memory cell in the writing and reading period.

As shown in FIG. 3, when the first memory cell is written to, the Q-th memory cell is being read in the same time, and therefore a read/write collision will occur in area 20. When the writing operation is continuously carried out to the P-th memory cell, the reading operation is carried out from the first memory cell, so a read/write collision also will occur in area 30.

In this embodiment, the position where the reading and writing operations collide is more complicated than that of the first embodiment, and thus the number of memory cells in every memory bank must be determined respectively. The memory cell number I of the first memory bank must be less than Q, such that read/write collision can be prevented during any clock pulse of the reading and writing operations. Therefore, when the first memory cell of the first memory bank is written to, the writing operation is continuously performed to the (I+1)-th memory cell of the second memory bank, so a read/write collision can be prevented in the area 20. Because the reading speed is twice that of the writing speed, the reading enable clock signal always proceeds the writing enable clock signal in the area 20.

The number of memory cells in the second memory bank is II, and depends on the number I of memory cells of the first bank. In view of the read/write collision area 30, the data is continuously and sequentially written during the writing enable clock signal. Therefore, when the reading operation finishes accessing I memory cells in the first memory bank, the writing operation starts to write to the (P+I/2)-th memory cells, because the reading speed is twice that of the writing speed in this embodiment, i.e., the time to read I memory cells is equal to the time to write I/2 memory cells. Accordingly, the maximal number of the memory cells of the second memory bank should not be greater than (P+I/2)−I, i.e., P−I/2. Therefore, when the second memory bank is read during the reading enable clock signal, the next memory bank is written during the writing enable clock signal such that read/write collisions can be prevented. Similarly, the maximum number of memory cells III of the third memory bank should be no greater than (P+(I+II)/2) (I+II), i.e., P−(I+II)/2. The number of memory cells in the rest of the memory banks can be determined in the same way described above. The necessary conditions of the memory cell number in the memory banks are listed as follows:

| First memory bank | I < Q; |
|---|---|
| Second memory bank | II < P − I/2; |
| Third memory bank | III < P − (I + II)/2; |
| Fourth memory bank | IV < P − (I + II + III)/2. |

In short, the memory cell number of every memory bank is not more than the difference between P and half of the sum of the total memory cells in the memory banks which are placed before the P-th cell. In this way, the memory cells are continuously divided until all the memory cells are included by all memory banks respectively.

As described in the first embodiment, the number of memory cells in the memory banks must be decided according to the following two conditions. First, the smaller the number of SRAM memory banks the better. Second, the number of memory cells for every memory bank should be the same, or in proportional relation to be suitable for layout design. However, the above principles should not be used to restrict the present invention.

An example is demonstrated to explain the embodiment. Provided that the system specifications are:

Reading enable clock signal clock: 12.5 MHz;

Writing enable clock signal clock: 25 MHz; and data capacity: 664 words (8×83).

The specifications of the system are appropriate for a video processing application to transform NTSC signals into VGA signals. When the 349-th data are written, the first data start to be read out, i.e., P is equal to 349. When the 102-th data are read out, the first data start to be written, i.e., Q is equal to 102. Although, in this example, a word is used as a data unit, the bank dividing method described above is still appropriate. By using the dividing method described above, the memory cells can be divided into 6 banks. Taking the suitable number of banks and the suitable number of memory cells for each respective bank into consideration, the memory cell numbers of the respective banks can be 96, 192, 192, 192, 96, 56, 32 respectively. The following formulas should be followed in determining the number of memory cells that the respective memory banks should include:

I=96<Q=102

II=192<A−I/2=349−96/2=301

III=192 <A−(I+II)/2=349−(96+192)/2=205

IV=96<A−(I+II+III)/2=349−(96+192+192)/2=109

V=56<A−(I+II+III+IV)/2=349−(96+192+192+96)/2=61

VI=32<A−(I+II+III+IV+V)/2=349−(96+192+192+96+56)/2=33

Figure 4:
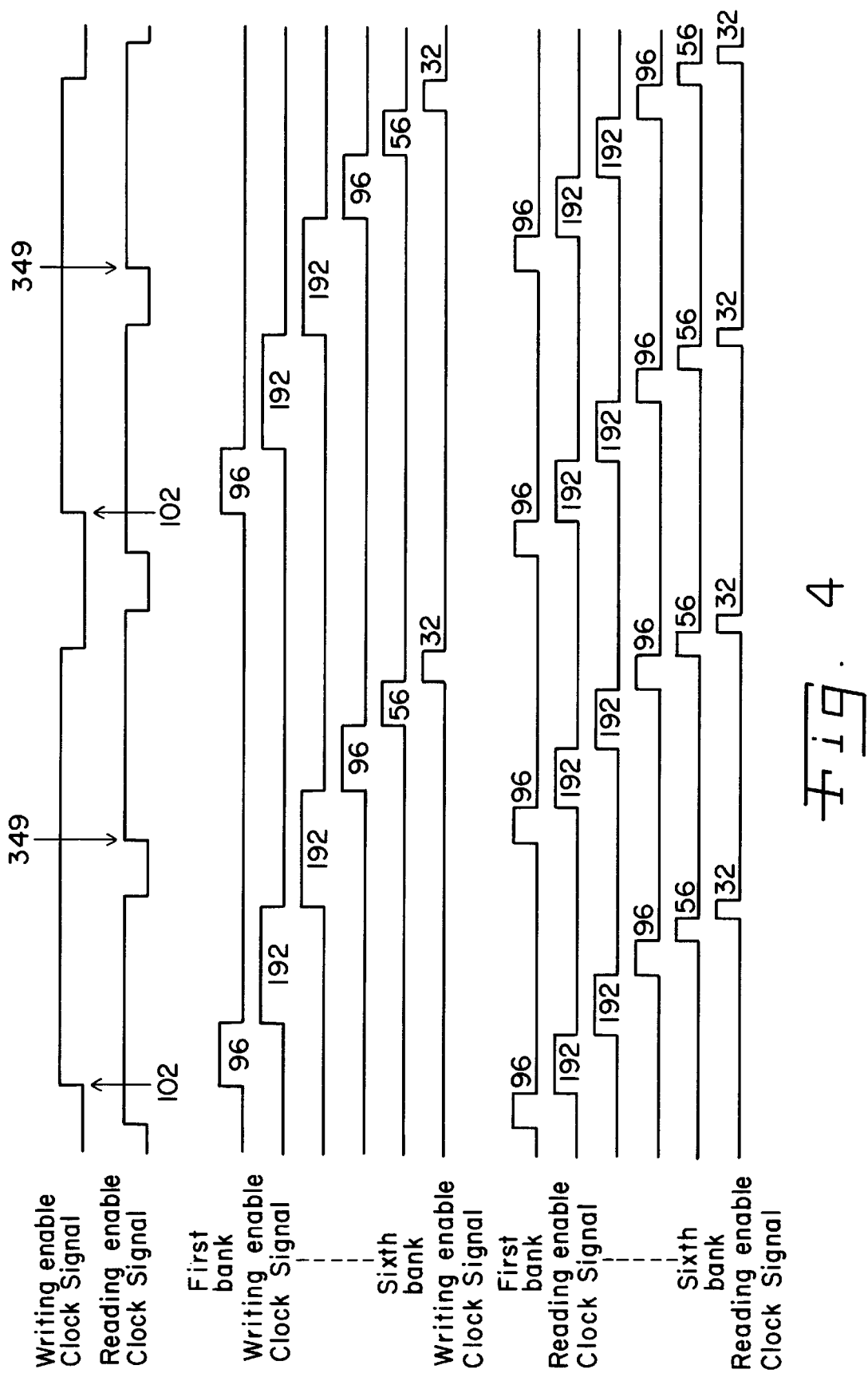
FIG. 4 illustrates the reading and writing enable clock signal of every memory bank of the example in the second embodiment according to the present invention.

Consequently, the word numbers of memory banks conform to the restriction of memory cells, and the total number of words is 664. FIG. 4 illustrates the reading enable clock signal and the writing enable clock signal with respect to the memory banks. It is obvious from FIG. 4 that read/write collisions will not occur during reading and writing operations to all the memory banks. This conforms to the requirement of the present invention.

As described above, the features of the present invention are that the memory cells of the SRAM are divided into several memory banks. Every memory bank has independent reading and writing paths, i.e., when a certain memory bank is performing read/write operations, another memory bank is also performing read/write operations such that read/write collisions can be prevented. The advantages of the present invention is that the SRAM can be read and written to simultaneously without read/write collisions by dividing the memory cells into several memory banks. The present invention does not take the conventional structure of duplicate memory cell, so the chip area required for a SRAM is reduced and thus the cost is reduced.

Although the present invention has been described in terms of some specific embodiments, it is anticipated that alternations and modifications thereof will no doubt become apparent to those skilled in the art. It is therefore intended that the following claims be interpreted as covering all such alternations and modifications as fall within the true spirit and scope of the invention.

What is claimed is:

1. A static random access memory which can perform reading and writing operations simultaneously at particular respective reading and writing speeds without data collision, said memory comprising:

a plurality of memory cells;

a plurality of memory banks which are formed by dividing said memory cells into several blocks, wherein every one of said memory banks has independent reading paths and writing paths, the number of memory cells in every said memory bank is determined by a specific length of memory cells between some memory cells undergoing the reading operation and the other memory cells undergoing the writing operation and by the reading speed of said reading operation and the writing speed of said writing operation, so that said reading operation and said writing operation reads and writes to two different memory banks of said static random access memory at the same time.

2. A static random access memory as in claim 1, wherein said memory cells in each bank can be sequentially read and written.

3. A static random access memory as in claim 1, wherein said reading speed and said writing speed have the same operating speed.

4. A static random access memory as in claim 1, wherein said reading speed and said writing speed have different operating speeds.

5. A static random access memory as in claim 4, wherein said reading speed is a multiple of said writing speed.

6. A static random access memory as in claim 4, wherein said reading speed is twice of said writing speed.

7. A static random access memory as in claim 1, wherein the number of said memory banks is the minimum.

8. A static random access memory which can perform reading and writing operations simultaneously having particular respective reading and writing speeds without data collisions and said reading speed and said writing speed are of the same operating speed, said memory comprising:

a plurality of memory banks wherein each one of said banks includes a plurality of memory cells, independent reading paths and writing paths, and said memory cells of each said memory bank can be sequentially read and written, and when said static random access memory has N memory cells and a memory cell interval between a memory cell undergoing the reading operation and another memory cell undergoing the writing operation has A memory cells, the number of memory cells in each one of said memory banks is not more than A, wherein N and A are integers.

9. The static random access memory as in claim 8, wherein each one of said memory banks has the same number of memory cells, and the number of said memory banks is at least N/A.

10. The static random access memory as in claim 8, wherein the number of said memory banks is the minimum.

11. A static random access memory which can perform reading and writing operations with particular respective reading and writing speeds simultaneously without data collisions and the reading speed is twice of said writing speed, said memory comprising:

a plurality of memory banks including a first memory bank, wherein each one of said banks includes a plurality of memory cells having a first memory cell, independent reading paths and writing paths, and said memory cells of said memory banks can be sequentially read and written, and said static random access memory has N memory cells, a Q-th memory cell, a P-th memory cell, and when the first memory cell of said N memory cells is written to during the writing operation, the Q-th memory cell of said N memory cells is read during the reading operation, and when the P-th memory cell of said N memory cells is written to during the writing operation, the first memory cell of said N memory cells is read during the reading operation, and the number of memory cells in the first memory bank of said memory banks is not larger than Q, and the number of memory cells in each of the non-first memory banks is no greater than P–T, wherein T is one-half of the total number of memory cells in all banks before said P-th memory cell, and N, P, Q, and T are integers.

12. The static random access memory as in claim 11, wherein the number of said memory banks is the minimum.

* * * * *